(12) United States Patent
Nakayama et al.

(10) Patent No.: US 12,191,231 B2
(45) Date of Patent: Jan. 7, 2025

(54) ROTARY MACHINE WITH ELECTRIC MOTOR AND IMPELLER

(71) Applicant: IHI Corporation, Tokyo (JP)

(72) Inventors: Shun Nakayama, Tokyo (JP); Yuji Sasaki, Tokyo (JP)

( * ) Notice: Subject to any disclaimer, the term of this patent is extended or adjusted under 35 U.S.C. 154(b) by 179 days.

(21) Appl. No.: 18/064,932

(22) Filed: Dec. 13, 2022

(65) Prior Publication Data
US 2023/0110813 A1    Apr. 13, 2023

Related U.S. Application Data

(63) Continuation of application No. PCT/JP2021/031399, filed on Aug. 26, 2021.

(30) Foreign Application Priority Data

Sep. 3, 2020 (JP) ................................. 2020-148131

(51) Int. Cl.
| | | |
|---|---|---|
| *H01L 23/467* | (2006.01) | |
| *F04D 29/58* | (2006.01) | |
| *F04C 18/02* | (2006.01) | |

(52) U.S. Cl.
CPC ........ *H01L 23/467* (2013.01); *F04D 29/5813* (2013.01); *F04C 18/0207* (2013.01); *F05B 2210/12* (2013.01)

(58) Field of Classification Search
CPC ............... H01L 23/467; F04D 23/5813; F04C 18/0207; F05B 2210/12
USPC ....................................................... 165/80.3
See application file for complete search history.

(56) References Cited

U.S. PATENT DOCUMENTS

| | | | |
|---|---|---|---|
| 11,509,179 B2 * | 11/2022 | Lee | ........................... H02K 9/06 |
| 2010/0158714 A1 | 6/2010 | Werson et al. | |
| 2013/0302155 A1 | 11/2013 | Tamaki | |
| 2020/0006997 A1 * | 1/2020 | Kim | .......................... H02K 5/04 |

FOREIGN PATENT DOCUMENTS

| | | |
|---|---|---|
| JP | H3-111700 | 5/1991 |
| JP | 2004-274992 | 9/2004 |
| JP | 2008-057426 | 3/2008 |
| JP | 2012-062777 | 3/2012 |
| JP | 2013-024057 | 2/2013 |
| JP | 2013-176193 | 9/2013 |
| JP | 2013-188105 | 9/2013 |
| WO | 98/030790 | 7/1998 |
| WO | 2012/102146 | 8/2012 |

OTHER PUBLICATIONS

International Search Report dated Oct. 12, 2021 for PCT/JP2021/031399.
International Preliminary Report on Patentability with Written Opinion dated Mar. 16, 2023 for PCT/JP2021/031399.

* cited by examiner

*Primary Examiner* — Joel M Attey
(74) *Attorney, Agent, or Firm* — SOEI PATENT & LAW FIRM

(57) ABSTRACT

A rotary machine includes an electric motor, an impeller to be rotated by driving the electric motor and suck in and compress a gas, and a housing that houses the impeller and includes a suction port for the gas. The rotary machine further includes heat dissipation fins provided on the housing and disposed to be heat-exchangeable with the gas passing through the suction port, and an inverter connected to the housing and that controls the electric motor.

18 Claims, 6 Drawing Sheets

ROTARY MACHINE WITH ELECTRIC MOTOR AND IMPELLER

CROSS-REFERENCE TO RELATED APPLICATIONS

This application is a continuation application of PCT Application No. PCT/JP2021/031399, filed on Aug. 26, 2021, which claims the benefit of priority from Japanese Patent Application No. 2020-148131, filed on Sep. 3, 2020. The entire contents of the above listed PCT and priority applications are incorporated herein by reference.

BACKGROUND

Field

The present disclosure relates to a rotary machine.

Description of the Related Art

International Publication No. WO 2012/102146 discloses a centrifugal compressor in which a turbine impeller is rotated by exhaust gas from an engine, and a compressor impeller provided coaxially with a turbine via a rotating shaft rotates to supply compressed air to the engine. Japanese Unexamined Patent Publication No. 2012-62777 and Japanese Unexamined Patent Publication No. 2013-176193 disclose rotary machines in which a compressor impeller is rotated by driving an electric motor. Japanese Unexamined Patent Publication No. 2008-57426 discloses a compressor in which a compression mechanism compresses a refrigerant by driving an electric motor. Japanese Unexamined Patent Publication No. 2013-24057 discloses a centrifugal compressor in which a compressor impeller is rotated by driving an electric motor. Japanese Unexamined Patent Publication No. 2013-188105 discloses an electric motor that rotates a shaft. Japanese Unexamined Patent Publication No. 1991-111700 discloses an electric blower. Japanese Unexamined Patent Publication No. 2004-274992 discloses an inverter-integrated AC electric motor. Japanese Unexamined Patent Publication No. 2012-62777 and Japanese Unexamined Patent Publication No. 2013-176193 disclose inverters each driving and controlling an electric motor that rotates a compressor impeller.

SUMMARY

Disclosed herein is an example rotary machine. The rotary machine including: an electric motor; an impeller configured to rotate through driving of the electric motor and suck in and compress a gas; a housing configured to house the impeller and include a suction port for the gas; a heat sink provided in the housing; heat dissipation fins provided on the heat sink and disposed to be heat-exchangeable with the gas passing through the suction port; and an inverter configured to control driving of the electric motor and connected to the heat sink.

An example rotary machine including: an electric motor; an impeller configured to rotate through driving of the electric motor and suck in and compress a gas; an impeller casing configured to house the impeller; a pipeline portion connected to the impeller casing to form a suction port for the gas; an inverter configured to abut the pipeline portion and control driving of the electric motor; and heat dissipation fins configured to protrude from an inner circumferential surface of the pipeline portion and disposed in a flow path for the gas.

DETAILED DESCRIPTION

Figure 1:
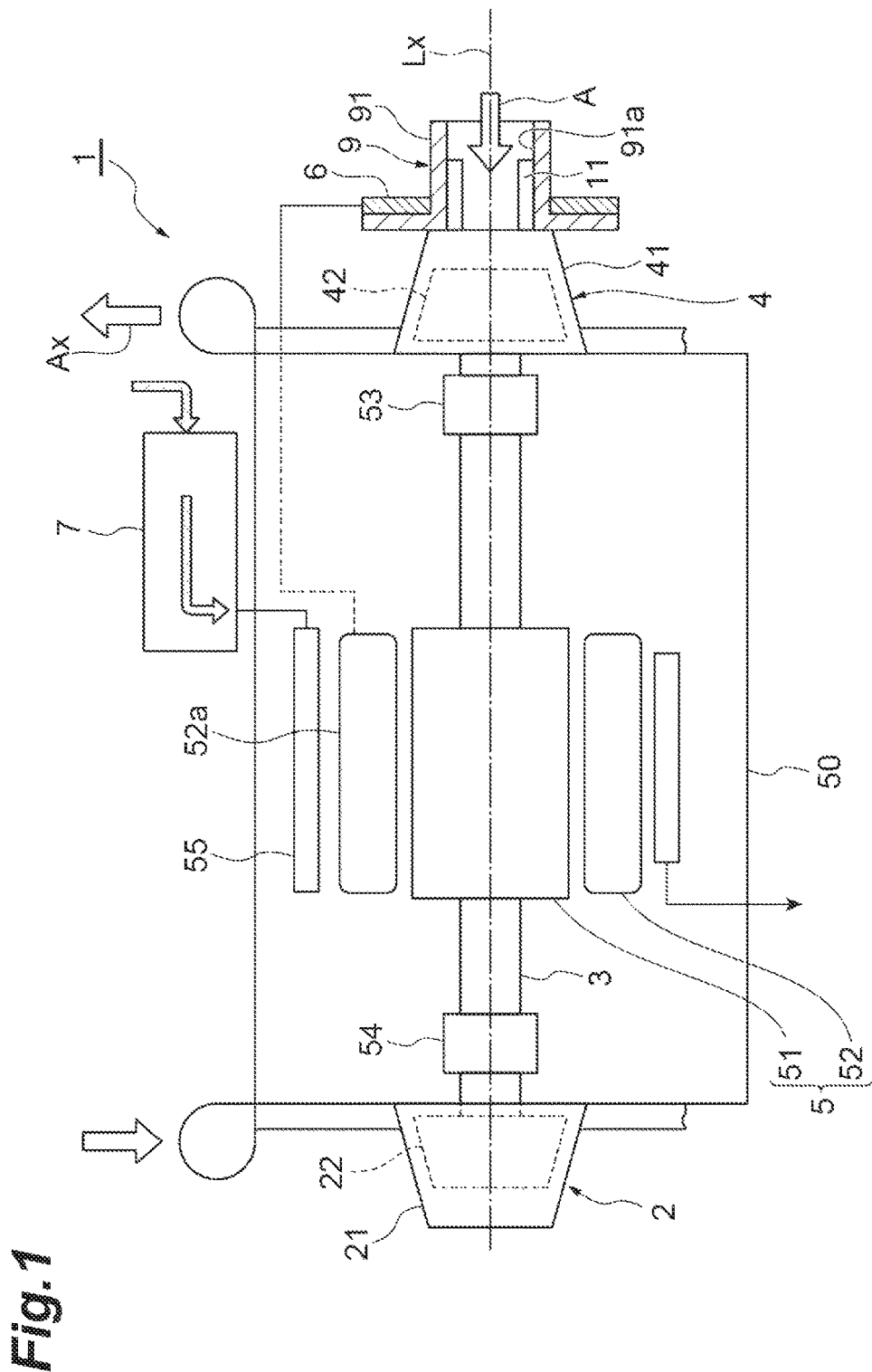
FIG. 1 is a schematic explanatory diagram illustrating an example rotary machine.

In the following description, with reference to the drawings, the same reference numbers are assigned to the same components or to similar components having the same function, and overlapping description is omitted.

An example rotary machine including an electric motor, an impeller that rotates through driving of the electric motor and sucks in and compresses a gas, a housing that houses the impeller and includes a suction port for the gas, a heat sink provided in the housing, heat dissipation fins that are provided on the heat sink and disposed to be heat-exchangeable with the gas passing through the suction port, and an inverter that controls driving of the electric motor and is connected to the heat sink.

In one example, the inverter thermally connected to the heat dissipation fins via the heat sink. The heat dissipation fins are disposed to be heat-exchangeable with the gas passing through the suction port. That is, it cools the inverter using the gas sucked through the suction port due to the rotation of the impeller. As a result, the inverter can be cooled even if a cooling channel for the inverter is reduced. Also, depending on a flow rate of the gas passing through the suction port, the cooling channel for the inverter can be omitted. That is, a space for forming the cooling channel for the inverter can be reduced.

In one example, the inverter may be annular and disposed to surround the suction port. Since the annular inverter surrounds the suction port, an uneven cooling effect is less likely to be generated in a circumferential direction of the inverter, and the inverter can be uniformly cooled in the circumferential direction of the inverter.

In one example, the heat dissipation fins may protrude from an inner circumferential surface of the suction port and be disposed in a flow path for the gas. Since the heat dissipation fins protrude from the inner circumferential surface of the suction port, they are in direct contact with the gas passing through the suction port and are deprived of heat. As a result, the cooling efficiency of the inverter can be improved.

In one example, the heat dissipation fins may extend along a rotation axis of the impeller. A flow of gas passing through the suction port is likely to be disturbed near the inner circumferential surface of the suction port. On the other hand, in the rotary machine, since the heat dissipation fins align the flow in a rotation axis direction of the impeller, it becomes easier to obtain rectification and a surge margin can be improved.

In one example, lengths of the heat dissipation fins along the rotation axis may be longer than heights thereof protruding from the inner circumferential surface. As a result, it can reduce a pressure loss of the gas passing through the suction port and improve the cooling efficiency of the inverter.

In one example, the heat sink may include a pipeline portion forming the suction port, and a flange portion protruding outward from the pipeline portion. Further, the inverter may be annular and connected to the heat sink while abutting the flange portion. Since the inverter is disposed to surround the suction port via the flange portion, it is uniformly cooled in the circumferential direction without unevenness.

In one example, the heat sink may include a pipeline portion forming the suction port, the inverter may abut an outer circumferential surface of the pipeline portion to be connected to the heat sink, and the heat dissipation fins may protrude from an inner circumferential surface of the pipeline portion.

In one example, the heat dissipation fins may be disposed at regular intervals (regular intervals) in a circumferential direction around the rotation axis of the impeller.

In one example, the heat sink may include an inner tube portion forming the suction port and an outer tube portion provided on an outer side of the inner tube portion, and the heat dissipation fins may be disposed between the inner tube portion and the outer tube portion and be connected to the inner tube portion in a heat-exchangeable manner.

An example rotary machine including an electric motor, an impeller that rotates through driving of the electric motor and sucks in and compresses a gas, an impeller casing that houses the impeller, a pipeline portion connected to the impeller casing to form a suction port for the gas, an inverter that abuts the pipeline portion and controls driving of the electric motor, and heat dissipation fins that protrude from an inner circumferential surface of the pipeline portion and are disposed in a flow path for the gas.

FIG. 1 illustrates an example of a rotary machine 1 according to the present disclosure. It is an electrically assisted turbocharger. The rotary machine 1 includes a turbine 2 that rotates by receiving a flow of exhaust gas, a rotating shaft 3 that transmits a rotational force of the turbine 2, and a compressor 4 that takes in and compresses air A (an example of a gas) by the rotational force of the turbine 2. Also, the rotary machine 1 has an electric motor 5 between the turbine 2 and the compressor 4. Driving of the electric motor 5 is controlled by an inverter 6.

The electric motor 5 is housed inside a motor housing 50. A turbine housing 21 is fixed to one end portion of the motor housing 50, that is, to one side surface thereof along the rotating shaft 3. A turbine impeller 22 that transmits the rotational force to the rotating shaft 3 is disposed in the turbine housing 21. A compressor housing 41 is fixed to the other end portion of the motor housing 50, that is, to the other side surface thereof along the rotating shaft 3. A compressor impeller 42 that is rotated by the rotational force of the rotating shaft 3 is disposed in the compressor housing 41.

The electric motor 5 includes a rotor 51 fixed to the rotating shaft 3 and a stator 52 disposed to surround the rotor 51. The stator 52 has a core fixed to the motor housing 50 and coils 52a wound around the core. The coils 52a are electrically connected to the inverter 6. A rotation speed of the electric motor 5 is controlled through frequency control of electric power performed by the inverter 6.

The motor housing 50 is provided with a first bearing 53 and a second bearing 54 that rotatably support the rotating shaft 3. The first bearing 53 is disposed between the electric motor 5 and the compressor housing 41. The second bearing 54 is disposed between the electric motor 5 and the turbine housing 21. In addition, a cooling channel 55 for cooling the electric motor 5 is formed in the motor housing 50. The cooling channel 55 is provided so as to circulate around the stator 52. A refrigerant cooled by a heat exchanger 7 is introduced into the cooling channel 55. For example, in the case of water cooling, a liquid such as water can be used as the refrigerant.

Figure 2:
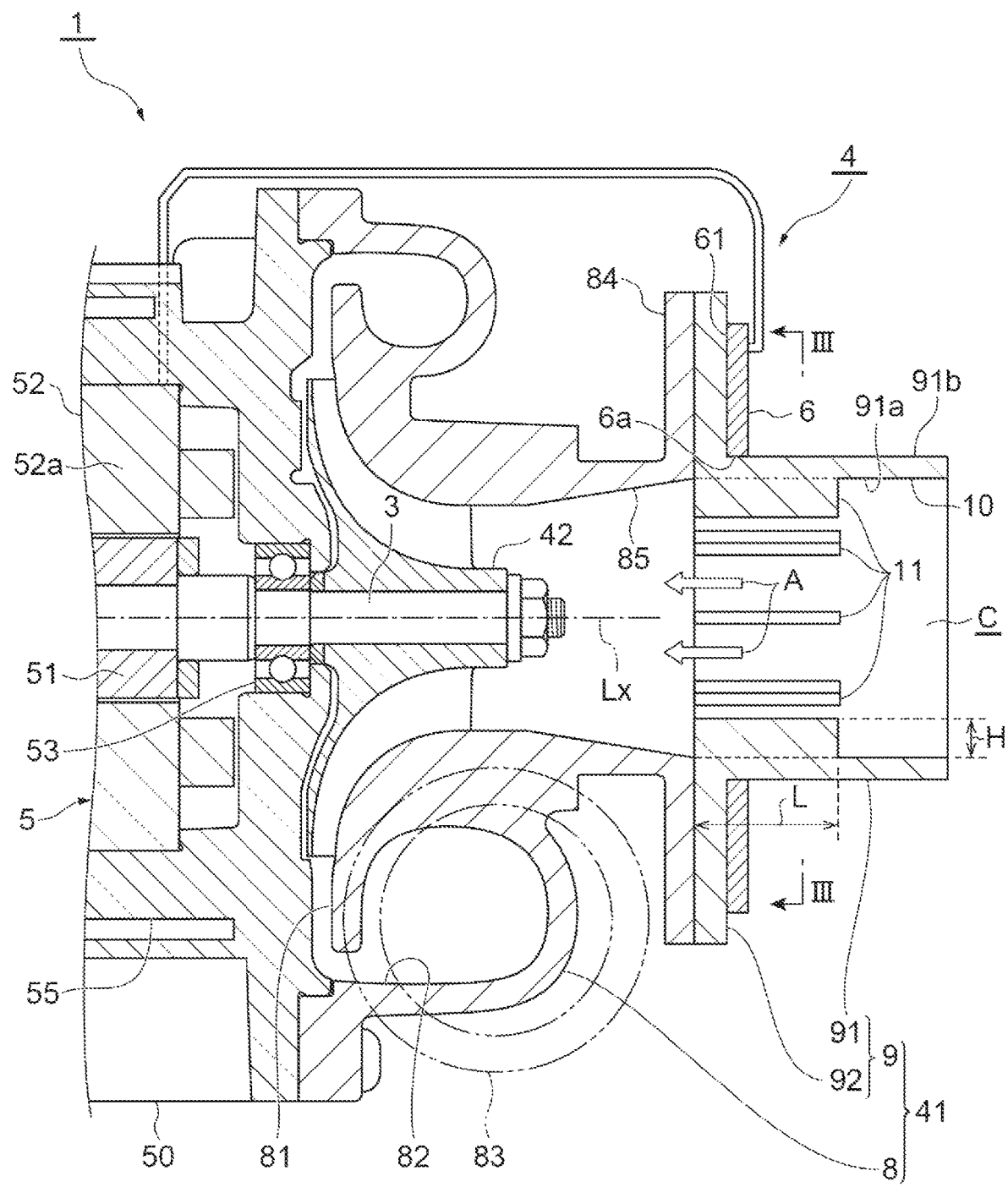
FIG. 2 is an enlarged cross-sectional view illustrating an example a compressor.

As illustrated in FIG. 2, the compressor housing 41 houses the compressor impeller 42 that rotates due to an action of the turbine 2 and the driving of the electric motor 5. The compressor impeller 42 rotates to suck in and compress the air A. The compressor housing 41 includes an impeller casing 8 that houses the compressor impeller 42 and a tubular heat sink 9 that forms a suction port 10.

The impeller casing 8 is provided with a diffuser 81 for boosting. The diffuser 81 is provided around the compressor impeller 42. Further, a scroll 82 and a discharge port 83 that communicate with the diffuser 81 are formed in the impeller casing 8. The discharge port 83 communicates with the scroll 82. The gas A is compressed with the diffuser 81. Compressed air Ax (compressed gas) that has passed through the scroll 82 is discharged from the discharge port 83. Also, the impeller casing 8 includes an end portion (an inlet portion) connected to the heat sink 9. The impeller casing 8 includes an outwardly protruding flange-shaped connection portion 84 at its end. An internal flow path 85 of the impeller casing 8 has an inner diameter that increases in a tapered manner toward the inlet portion.

The heat sink 9 includes a pipeline portion 91 that is connected to the impeller casing 8 and forms the suction port 10 for the air A, and a flange portion 92 that protrudes outward from the pipeline portion 91 (e.g., tubular portion). The flange portion 92 faces and debuts the connection portion 84. The heat sink 9 is fixed by abutting the connection portion 84 of the impeller casing 8 to the flange portion 92. Also, a form in which the impeller casing 8 is connected to the heat sink 9 may be another form, and the impeller casing 8 and the heat sink 9 may be integrally molded or integrated by welding or the like.

An inner circumferential surface 91a of the pipeline portion 91 corresponds to an inner circumferential surface of the suction port 10. The pipeline portion 91 is provided with a plurality of heat dissipation fins 11 that protrude from the inner circumferential surface 91a toward a center thereof (a rotation axis Lx). That is, the heat dissipation fins 11 are disposed in a flow path C through which the air A passes. As a result, the heat dissipation fins 11 are disposed to be heat-exchangeable with the air A passing through the suction port 10. The plurality of heat dissipation fins 11 are disposed at regular intervals in a circumferential direction Cd (see FIG. 3) around the rotation axis Lx. The heat dissipation fins 11 have rectangular plate shapes and extend along the rotation axis Lx. The heat dissipation fins 11 each have a length L along the rotation axis Lx longer than a height H thereof protruding from the inner circumferential surface 91a of the pipeline portion 91.

Figure 3:
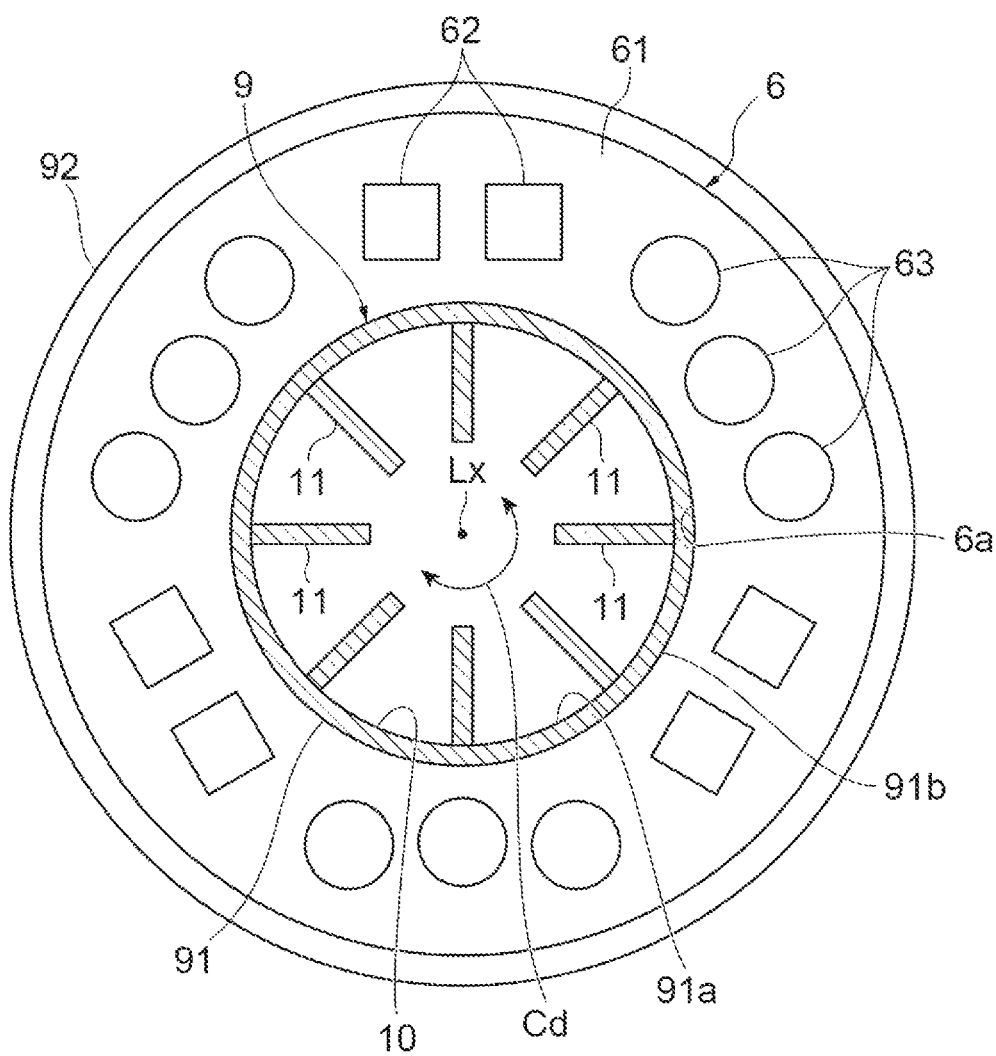
FIG. 3 is a cross-sectional view along line III-III in FIG. 2.

As illustrated in FIGS. 2 and 3, the inverter 6 is fixed (connected) to the flange portion 92 of the heat sink 9. That is, the inverter 6 is thermally connected to the heat sink 9. In some examples, the term "thermally connected" indicates heat-exchangeable connection, which includes a form of direct physical contact, and may also include a form of indirect connection via a heat conductive material such as heat transfer grease. Also, the form of indirect connection can also be defined as a state in which a thermal resistance is smaller than a thermal resistance in a state in which an air layer interposed.

In addition, the inverter 6 is annular (doughnut-shaped) and disposed to surround the suction port 10 when viewed in the direction along the rotation axis Lx. A surface of a substrate 61 of the inverter 6 abuts the flange portion 92 and is thermally connected thereto. An inner circumferential edge 6a of the inverter 6 is in contact with and thermally connected to an outer circumferential surface 91b of the pipeline portion 91.

Devices 62 such as IGBTs, bipolar transistors, MOSFETs, or GTOs, and power storage devices 63 such as capacitors are mounted on the substrate 61 of the inverter 6. A lead wire drawn from the inverter 6 is connected to the coils 52a of the electric motor 5 (stator 52).

As illustrated in FIGS. 2 and 3, the internal flow path 85 of the impeller casing 8 is located between the compressor impeller 42 and a heat dissipation fin 11 provided in the heat sink 9. The internal flow path 85 has an inner diameter that increases in a tapered manner from the impeller 42 to the heat dissipation fin 11. The internal flow path 85 has an inner diameter that gradually decreases from the dissipation fin 11 to the compressor impeller 42. The flange portion 92 surrounds the heat dissipation fins 11. The inverter 6 surrounds the heat dissipation fins 11 and debuts the flange portion 92.

Next, operations and effects of the rotary machine 1 will be described. The inverter 6 is connected to the heat dissipation fins 11 via the heat sink 9. The heat dissipation fins 11 are disposed to be heat-exchangeable with the air A passing through the suction port 10. That is, the rotary machine 1 can cool the inverter 6 using the air A sucked through the suction port 10 by the rotation of the compressor impeller 42. As a result, the rotary machine 1 enables cooling of the inverter 6 without providing a cooling channel for the inverter 6. For example, by using the air A, the inverter 6 can be cooled to less than 40° C. even in summer.

Also, when the compressor impeller 42 is operated under a high load, a temperature of the inverter 6 tends to rise. However, when a flow rate of the air A increases due to the high-load operation of the compressor impeller 42, the flow rate of the air A that comes into contact with the heat dissipation fins 11 to absorb heat also increases, and thus it can be offset from the viewpoint of the cooling effect, which is efficient.

Further, in the rotary machine 1, since it is assumed that the air A passing through the suction port 10 can cool the inverter 6, no other cooling channel is formed. However, it may form an auxiliary cooling channel branching from the cooling channel 55 for the electric motor 5 and to additionally cool the inverter 6 by means of this cooling channel. In this case, the cooling channel for cooling the inverter 6 may also be an auxiliary channel, and the configuration can be simplified.

In addition, the rotary machine 1 may comprise a turbocharger, and the turbine 2 is provided on a side opposite to the compressor 4 with the motor housing 50 (electric motor 5) interposed therebetween. The turbine 2 becomes hot, which is likely to be disadvantageous in terms of cooling. However, in the rotary machine 1, since the inverter 6 is disposed at a position separated from the turbine 2 with respect to the electric motor 5, the cooling effect can be easily enhanced.

As described above, according to the rotary machine 1, the cooling channel 55 for the inverter 6 can be omitted or used as an auxiliary. Accordingly, a space for forming the cooling channel for the inverter 6 can be reduced.

Also, the inverter 6 is annular and disposed to surround the suction port 10. As a result, an uneven cooling effect is less likely to be generated in the circumferential direction Cd of the inverter 6, that is, in the direction around the rotation axis Lx, which may achieve uniform cooling of the inverter 6.

Further, the heat dissipation fins 11 protrude from the inner circumferential surface 91a of the suction port 10 and are disposed on the flow path C of the air A. As a result, the heat dissipation fins 11 are in direct contact with the air A passing through the suction port 10 and are deprived of heat, so that the cooling efficiency of the inverter 6 can be improved.

Figure 4A:
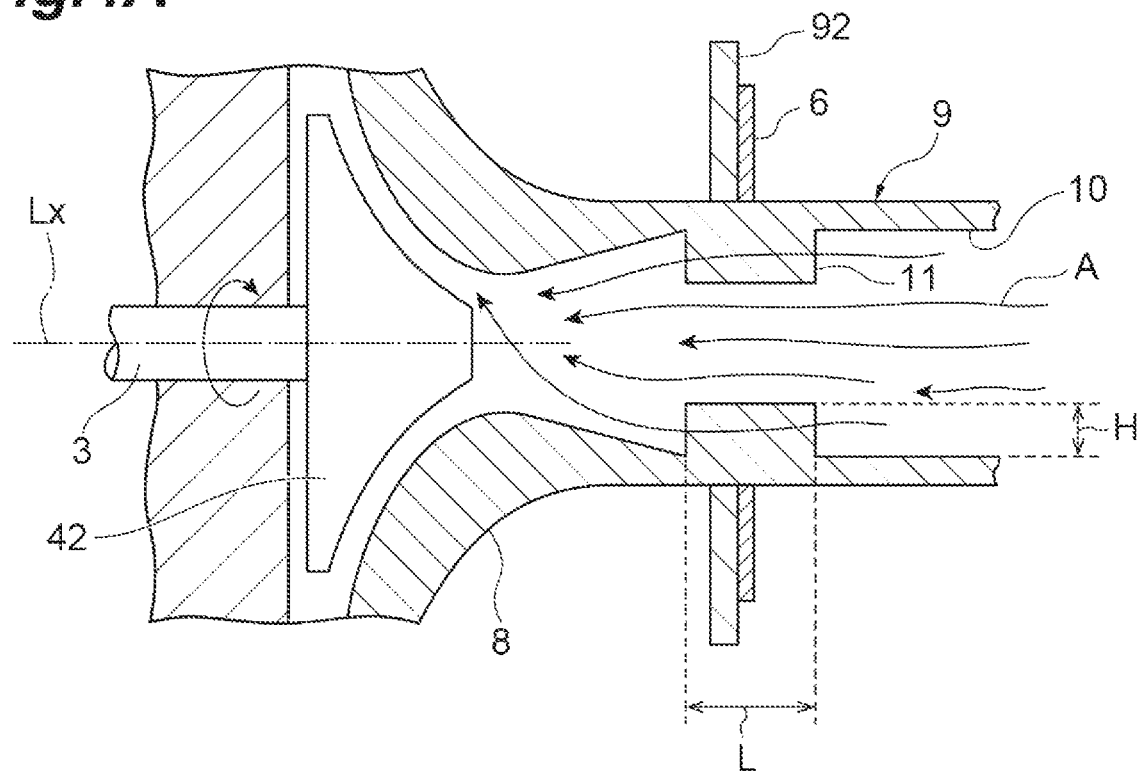
FIG. 4A is a schematic cross-sectional view illustrating a flow of air passing through a suction port of an example rotary machine on which heat dissipation fins are provided.
Figure 4B:
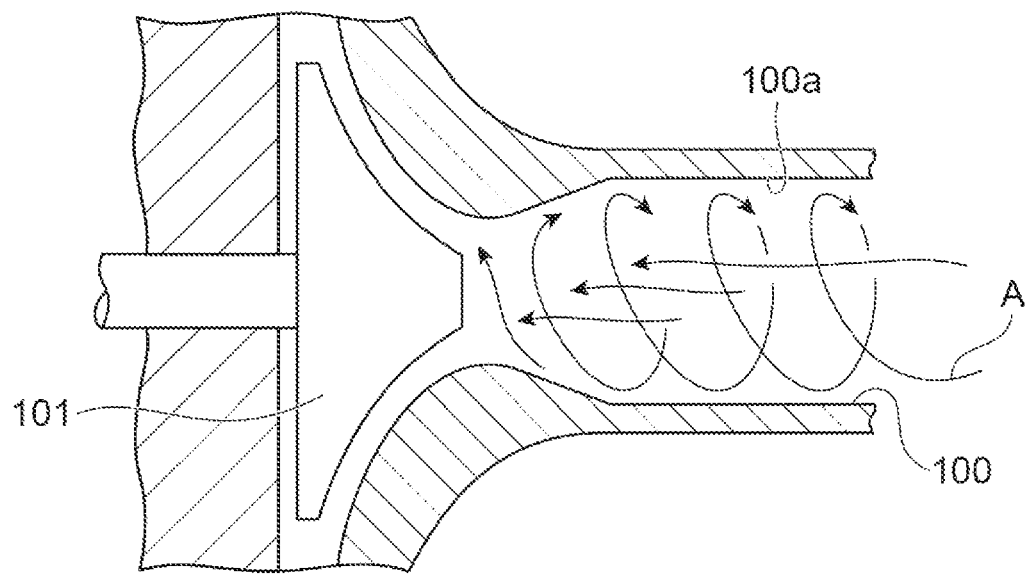
FIG. 4B is a schematic cross-sectional view illustrating a flow of air passing through a suction port of a comparative example rotary machine on which the heat dissipation fins are not provided.
Figure 5:
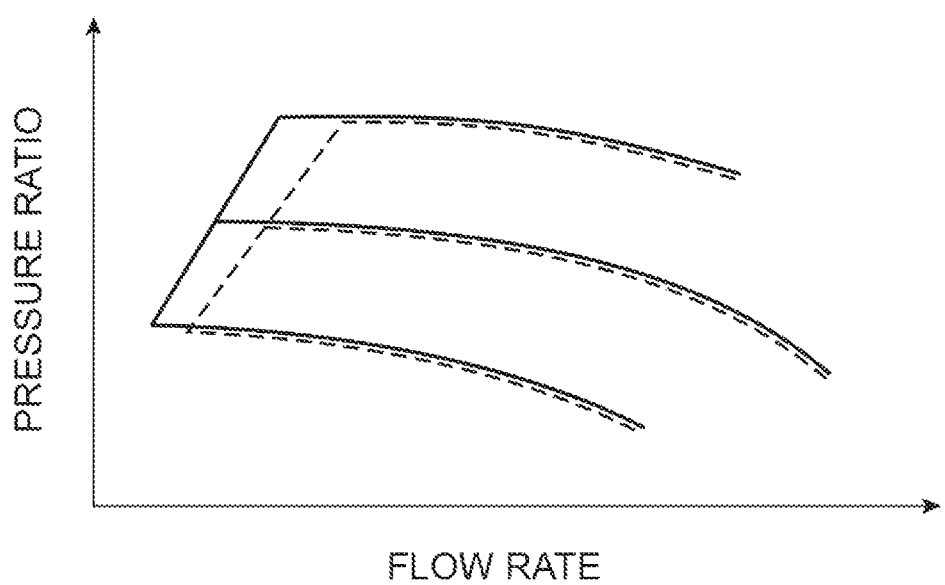
FIG. 5 is a graph illustrating a relationship between a flow rate and a pressure ratio.

In addition, the heat dissipation fins 11 extend along the rotation axis Lx of the compressor impeller 42, so that the surge margin can be improved. Performance when the motor is at a low speed is improved. This effect will be described with reference to FIGS. 4A, 4B and 5. Each of FIGS. 4A and 4B is a schematic cross-sectional view illustrating a flow of air A passing through the suction port 10. FIG. 4A illustrates an example rotary machine, and FIG. 4B illustrates a comparative example without the heat dissipation fins 11. Further, FIG. 5 is a graph illustrating a relationship between a flow rate and a pressure ratio, in which the example is indicated by a solid line and the comparative example is indicated by a dashed line.

As illustrated in FIG. 4B, the comparative example includes a compressor impeller 101 that sucks in air A from a suction port 100 and compresses it. In the comparative example, a flow of the air A passing through the suction port 100 is likely to be disturbed near an inner circumferential surface 100a of the suction port 100. On the other hand, as illustrated in FIG. 4A, in the rotary machine 1, the heat dissipation fins 11 align the flow in the direction of the rotation axis Lx of the compressor impeller 42, so that the surge margin can be improved at a low flow rate (when the motor is at a low speed).

In addition, as illustrated in FIG. 2, the lengths L of the heat dissipation fins 11 in the direction along the rotation axis Lx are longer than the heights H thereof protruding from the inner circumferential surface 91a. As a result, it may both reduce the pressure loss of the air A passing through the suction port 10 and improve the cooling efficiency of the inverter 6.

Further, the heat sink 9 includes the pipeline portion 91 forming the suction port 10 and the flange portion 92 protruding outward from the pipeline portion 91. The inverter 6 is annular and fixed to the heat sink 9 while abutting the flange portion 92. That is, the inverter 6 is disposed to surround the suction port 10 via the flange portion 92, which may achieve uniform cooling in the circumferential direction Cd without unevenness.

Figure 6:
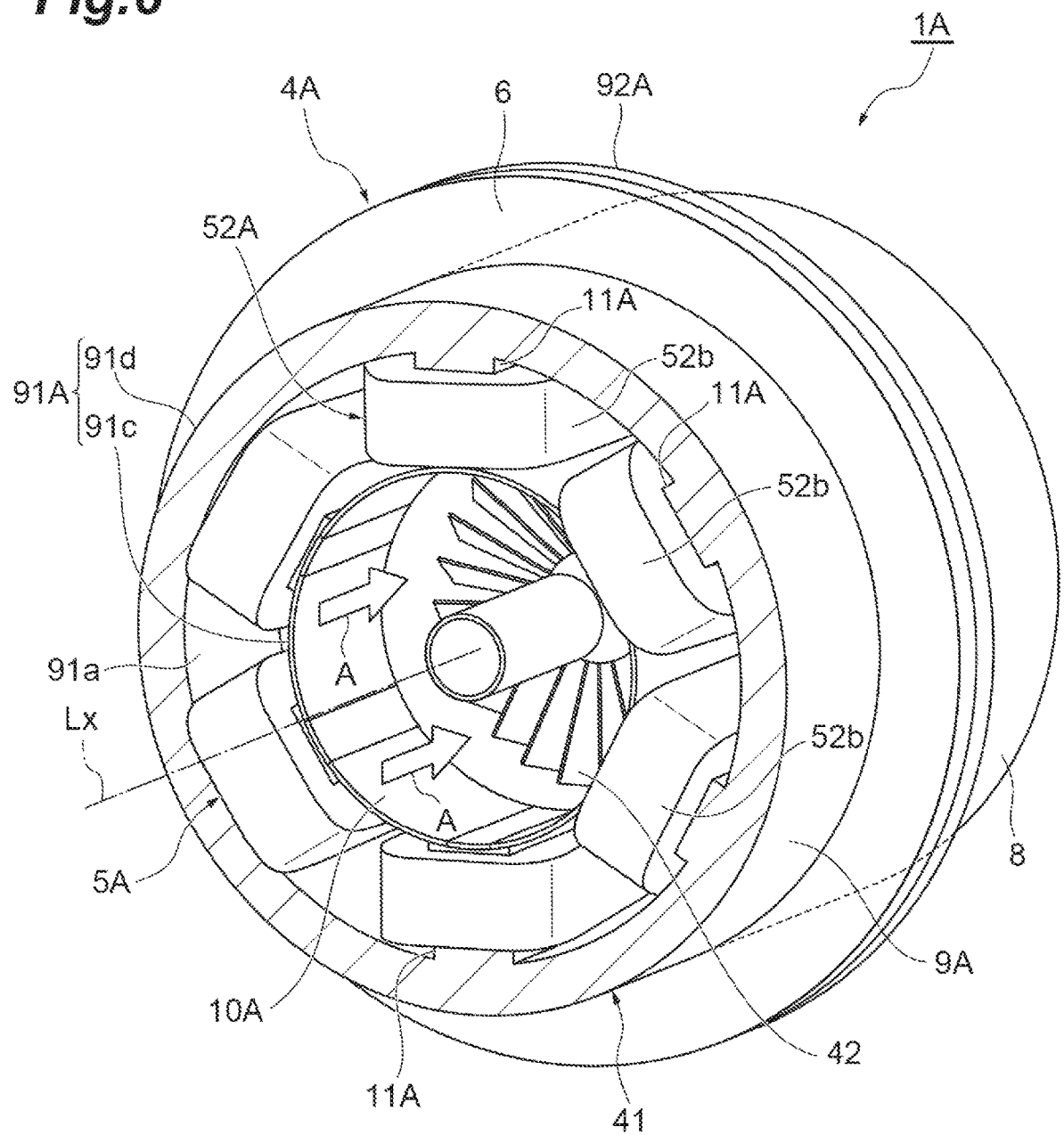
FIG. 6 is an enlarged perspective view of a compressor portion according to an example rotary machine.

Next, a rotary machine 1A according to an example will be described with reference to FIG. 6. FIG. 6 is an enlarged perspective view illustrating a portion of the compressor 4A of the rotary machine 1A, particularly where the suction port 10A is formed. Also, the rotary machine 1A according to an example has the same structure and configuration as the rotary machine 1 according to the above-described example, and thus the same structures and configurations will be denoted by the same reference numerals and detailed description thereof will be omitted.

As illustrated in FIG. 6, the compressor housing 41 houses the compressor impeller 42 that rotates through driving of the electric motor 5A and sucks in and compresses the air A. The compressor housing 41 includes the impeller casing 8 that houses the compressor impeller 42, and a heat sink 9A that forms a suction port 10A therein.

The heat sink 9A includes a pipeline portion 91A that is connected to the impeller casing 8 and forms the suction port 10A for the air A, and a flange portion 92A that protrudes outward from the pipeline portion 91A. The annular inverter 6 is fixed to the flange portion 92A in a heat-exchangeable manner.

The pipeline portion 91A has a double pipe structure, and the suction port 10A through which the air A passes is formed by an inner cylindrical portion (an inner pipe portion 91c). Further, heat dissipation fins 11A protruding from the inner circumferential surface 91a are provided on an outer cylindrical portion (an outer tube portion 91d). The heat dissipation fins 11A are disposed between the outer tube portion 91d and the inner tube portion 91c. The heat dissipation fins 11A are connected to the inner tube portion 91c in a heat-exchangeable manner and are disposed to be heat-exchangeable with the air A passing through the suction port 10A.

The heat dissipation fins 11A functions as a core of a stator 52A, and coils 52b are wound around the heat dissipation fins 11A to form the stator 52A. The heat dissipation fins 11A around which the coils 52b are wound extend along the rotation axis Lx and are disposed to surround a rotor fixed to the rotating shaft 3 to form an electric motor.

The inverter 6 is connected to the heat dissipation fins 11A via the heat sink 9A. The heat dissipation fins 11A are disposed to be heat-exchangeable with the air A passing through the suction port 10A. That is, the inverter 6 can be cooled using the air A sucked though the suction port 10A by the rotation of the compressor impeller 42. As a result, it may cool the inverter 6 without providing a cooling channel for the inverter 6. Also, depending on a flow rate of the air A passing through the suction port 10A, a cooling channel for the inverter 6 can be omitted. That is, a space for forming the cooling channel for the inverter 6 can be reduced.

It is to be understood that not all aspects, advantages and features described herein may necessarily be achieved by, or included in, any one particular example. Indeed, having described and illustrated various examples herein, it should be apparent that other examples may be modified in arrangement and detail. For example, an electrically assisted turbocharger has been described as one type of the rotary machine, but it is widely applicable to rotary machines with electric motors and impellers for compressing a gas, and for example, it may be a rotary machine that does not have a turbine and in which an impeller is mainly rotated by driving an electric motor.

What is claimed is:

1. A rotary machine comprising:
an electric motor;
an impeller to be rotated by driving the electric motor in order to suck in and compress a gas;
a housing that houses the impeller and includes a suction port for the gas;
heat dissipation fins provided on the housing and disposed to be heat-exchangeable with the gas passing through the suction port; and
an inverter connected to the housing and that controls the electric motor, wherein the inverter is annular and surrounds the suction port.

2. The rotary machine according to claim 1, wherein the heat dissipation fins protrude from an inner circumferential surface of the suction port and are disposed in a flow path for the gas.

3. The rotary machine according to claim 2, wherein the heat dissipation fins extend along a rotation axis of the impeller.

4. The rotary machine according to claim 3, wherein lengths of the heat dissipation fins along the rotation axis are longer than heights of the heat dissipation fins protruding from the inner circumferential surface.

5. The rotary machine according to claim 4,
wherein the housing comprises a heat sink forming the suction port, and
wherein the inverter abuts the heat sink.

6. The rotary machine according to claim 5,
wherein the heat sink includes a pipeline portion forming the suction port, and a flange portion protruding outward from the pipeline portion, and
wherein the inverter is connected to the heat sink while abutting the flange portion.

7. The rotary machine according to claim 6, wherein the inverter is annular and surrounds the pipeline portion.

8. The rotary machine according to any one of claim 6,
wherein the heat sink includes a pipeline portion forming the suction port,
wherein the inverter abuts an outer circumferential surface of the pipeline portion connected to the heat sink, and
wherein the heat dissipation fins protrude from an inner circumferential surface of the pipeline portion.

9. The rotary machine according to claim 8, wherein the heat dissipation fins are disposed at uniformly spaced intervals in a circumferential direction around a rotation axis of the impeller.

10. The rotary machine according to claim 4,
wherein the housing comprises a heat sink forming the suction port,
wherein the heat sink includes an inner tube portion forming the suction port and an outer tube portion provided on an outer side of the inner tube portion, and
wherein the heat dissipation fins are disposed between the inner tube portion and the outer tube portion and are connected to the inner tube portion in a heat-exchangeable manner.

11. A rotary machine comprising:
an electric motor;
an impeller to be rotated by driving the electric motor in order to suck in and compress a gas;
an impeller casing that houses the impeller;
a tubular portion connected to the impeller casing to form a suction port for the gas;
an annular shaped inverter that controls the electric motor; and
a heat dissipation fin that protrudes from an inner circumferential surface of the tubular portion and is disposed in a flow path for the gas,
wherein the inverter is located on an outer circumferential surface of the tubular portion opposite to the heat dissipation fin, so that the inverter surrounds the tubular portion.

12. The rotary machine according to claim 11, further comprising a flange portion that protrudes outward from the tubular portion, wherein the inverter abuts the flange portion.

13. The rotary machine according to claim 11, further comprising an internal flow path located between the impeller and the heat dissipation fin, and having an inner diameter that increases in a tapered manner from the impeller to the heat dissipation fin.

14. A rotary machine comprising:
- an electric motor;
- an impeller to be rotated by driving the electric motor;
- an impeller casing that houses the impeller and includes an internal flow path;
- a suction port fluidly coupled with the internal flow path;
- an annular shaped inverter that controls the electric motor and surrounds the suction port; and
- a heat dissipation fin located in the suction port to be heat-exchangeable with a gas passing through the internal flow path.

15. The rotary machine according to claim 14, wherein the internal flow path is located between the heat dissipation fin and the impeller.

16. The rotary machine according to claim 15, wherein the internal flow path has an inner diameter that gradually decreases from the dissipation fin to the impeller.

17. The rotary machine according to claim 14, wherein the impeller casing comprises a diffuser located around the impeller and a scroll fluidly coupled with the diffuser, and wherein the diffuser is fluidly coupled with the internal flow path via the impeller.

18. The rotary machine according to claim 17, further comprising a discharge port fluidly coupled with the scroll and configured to discharge the gas which is compressed with the diffuser and passes through the scroll.

* * * * *